(12) United States Patent
Nepomnishy et al.

(10) Patent No.: US 8,567,910 B2
(45) Date of Patent: Oct. 29, 2013

(54) DURABLE NON-WETTING COATING ON FLUID EJECTOR

(75) Inventors: Mark Nepomnishy, San Jose, CA (US); Gregory De Brabander, San Jose, CA (US); Andreas Bibl, Los Altos, CA (US)

(73) Assignee: FUJIFILM Corporation, Tokyo (JP)

( * ) Notice: Subject to any disclaimer, the term of this patent is extended or adjusted under 35 U.S.C. 154(b) by 471 days.

(21) Appl. No.: 12/752,062

(22) Filed: Mar. 31, 2010

(65) Prior Publication Data

US 2011/0242219 A1    Oct. 6, 2011

(51) Int. Cl.
B41J 2/14    (2006.01)
G01D 15/00    (2006.01)
G11B 5/127    (2006.01)

(52) U.S. Cl.
USPC ............................ 347/47; 216/27

(58) Field of Classification Search
USPC .................. 347/47; 216/27; 427/240, 299
See application file for complete search history.

(56) References Cited

U.S. PATENT DOCUMENTS

2007/0030306 A1    2/2007    Okamura et al.
2007/0221617 A1*   9/2007    Takahashi ....................... 216/58
2008/0136866 A1    6/2008    Okamura et al.
2008/0309718 A1*   12/2008   Oya et al. ......................... 347/47
2010/0149627 A1*   6/2010    Sasagawa et al. ............. 359/291
2010/0214354 A1*   8/2010    Ohshiba ......................... 347/22

FOREIGN PATENT DOCUMENTS

JP    9-300627    11/1997
WO    2010/051272    5/2010

OTHER PUBLICATIONS

Wikipedia [online]. "Fluropolymer", 2012, [retrieved on Jun. 16, 2012]. Retrieved from the Internet: http://en.wikipedia.org/w/index.php?title=Fluropolymer&printable=yes 3 pages.*
Wikipedia [online]. "Fluorine", 2012, [retrieved on Jun. 16, 2012]. Retrieved from the Internet: http://en.wikipedia.org/w/index.php?title=Fluorine&printable=yes 44 pages.*

* cited by examiner

*Primary Examiner* — Lisa M Solomon
(74) *Attorney, Agent, or Firm* — Fish & Richardson P.C.

(57) ABSTRACT

A method of forming a nozzle plate of a fluid ejection device includes etching a bore in the first side of the multi-layer substrate, depositing a liner in the bore, removing a layer from a second side of the multi-layer substrate, wherein the removing exposes a closed end of the liner, applying a non-wetting coating to the closed end of the liner and an area surrounding the closed end of the liner, and removing the closed end of the liner, wherein removing the closed end of the liner opens a nozzle.

17 Claims, 10 Drawing Sheets

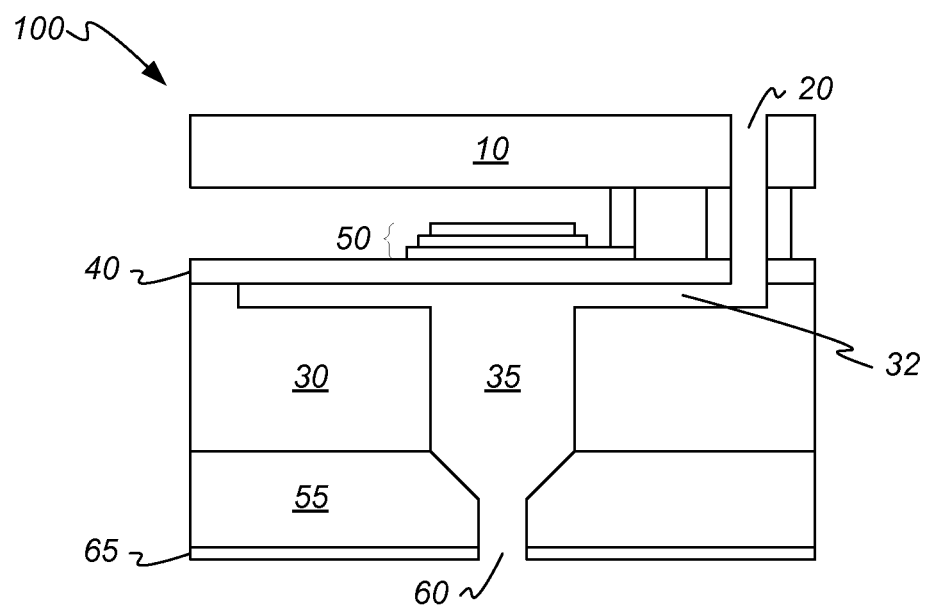
FIG._1

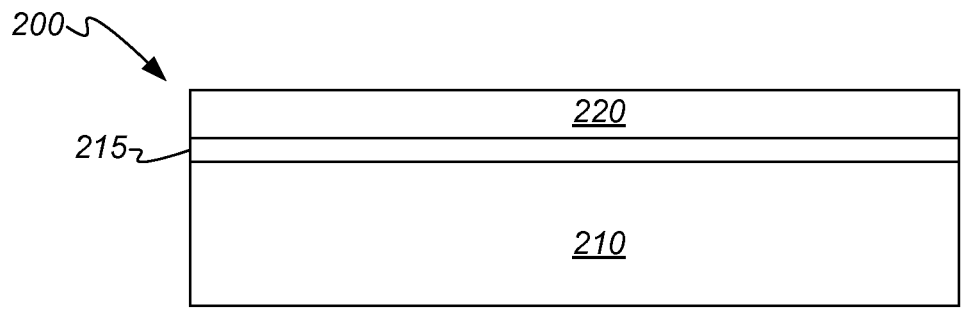
FIG._2
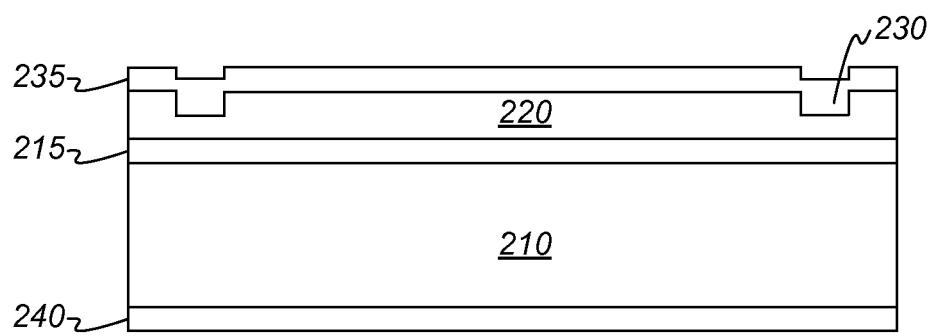
FIG._3
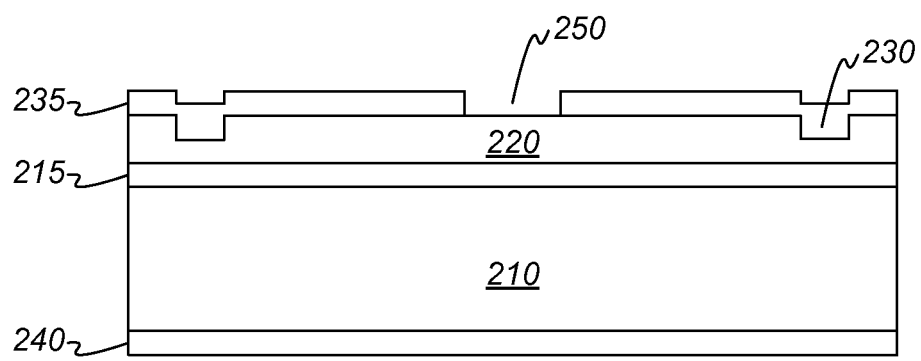
FIG._4

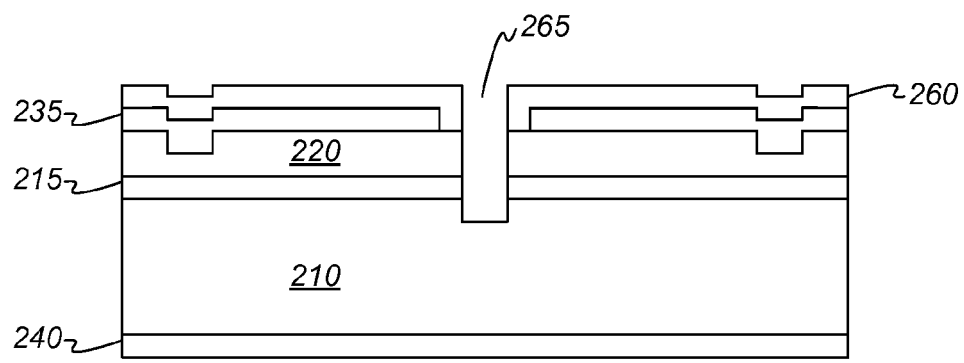
FIG._5
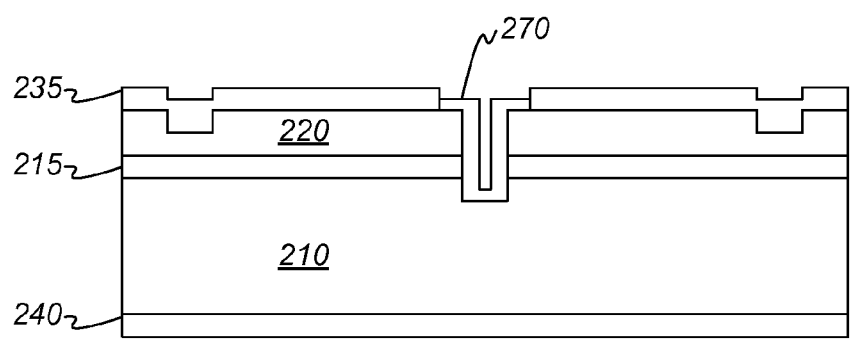
FIG._6
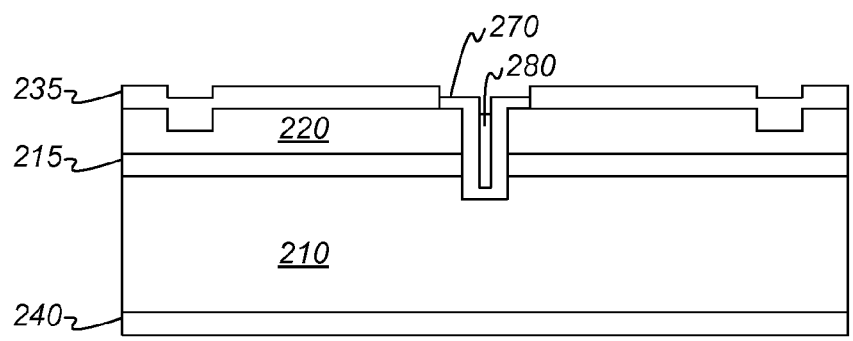
FIG._7

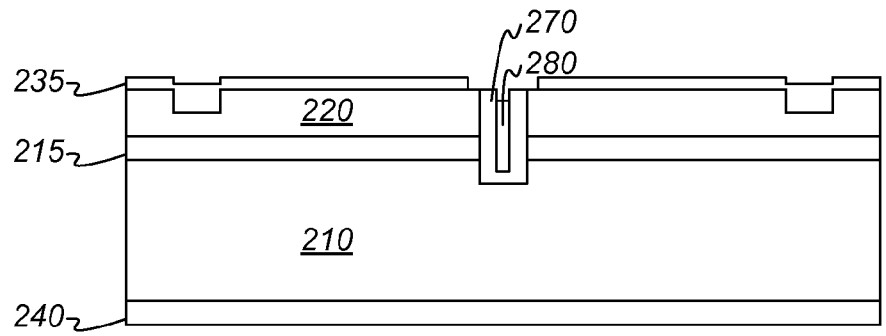
FIG._8
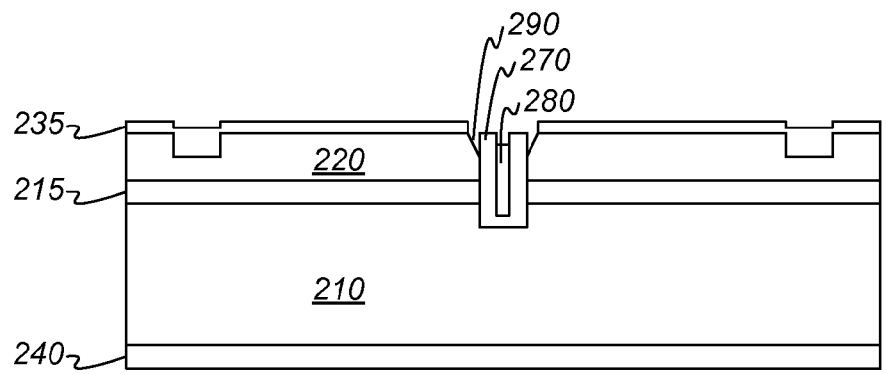
FIG._9
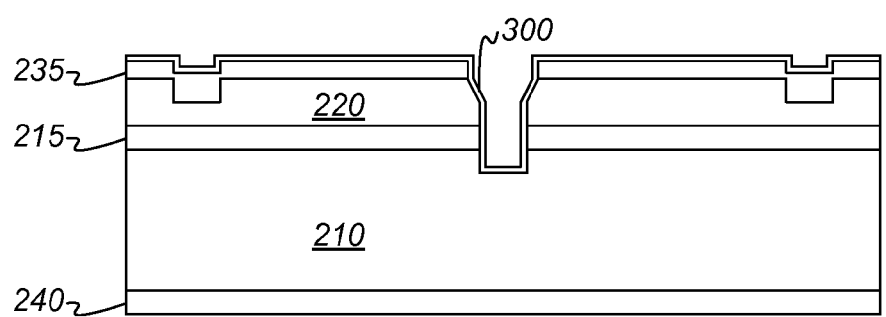
FIG._10

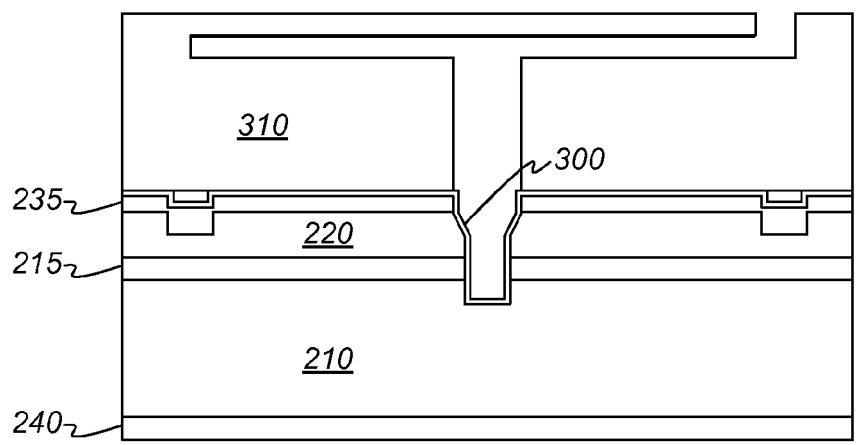
FIG._11
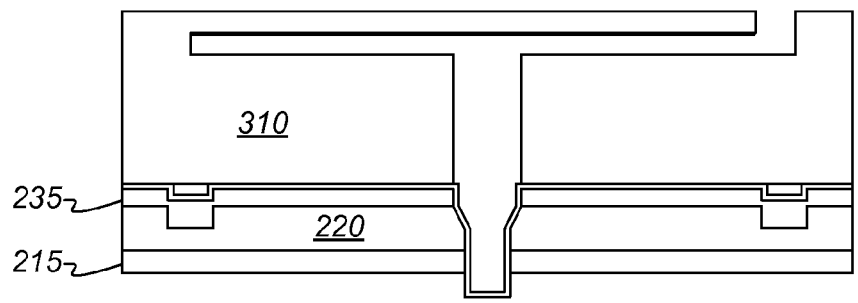
FIG._12
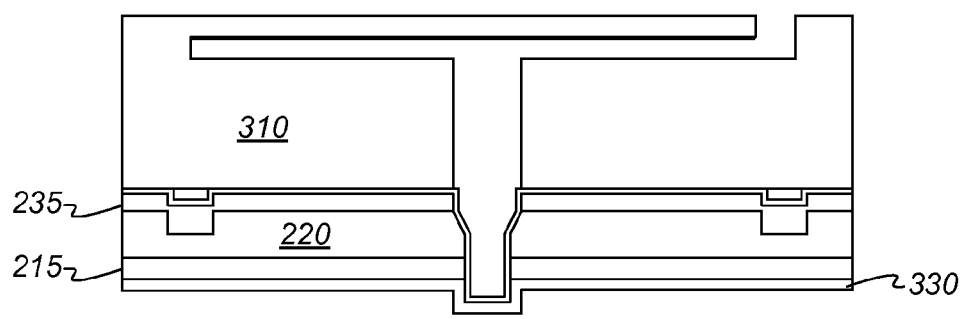
FIG._13

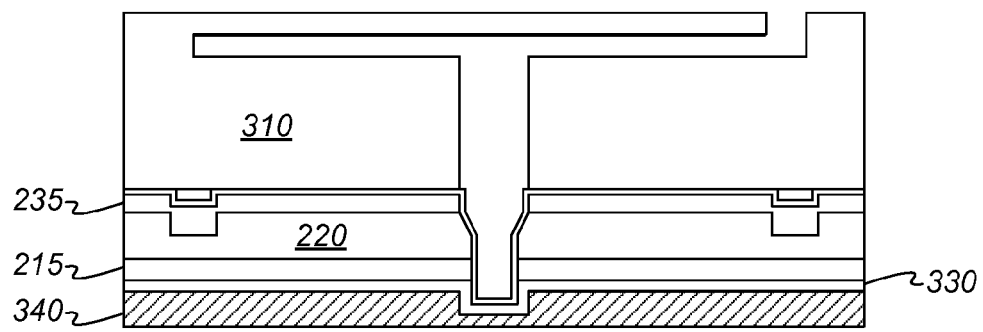
FIG._14
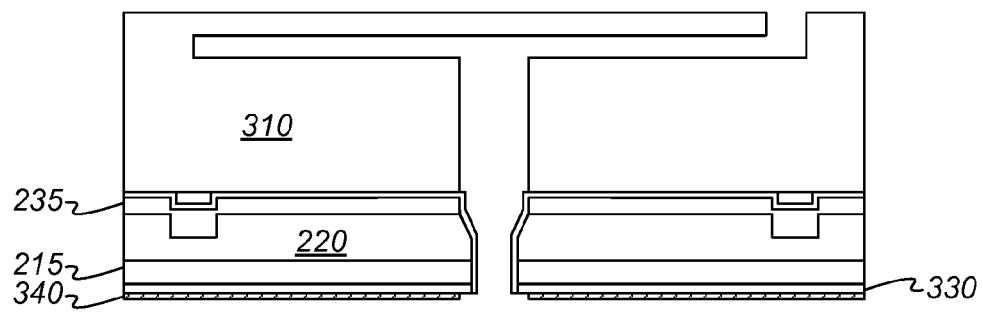
FIG._15
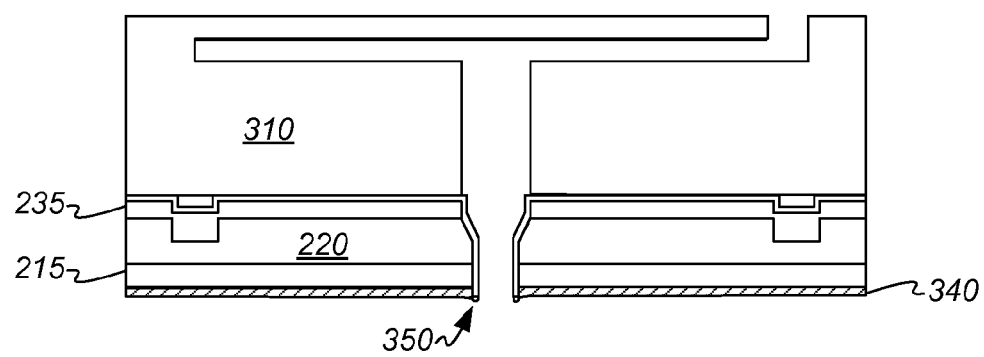
FIG._16

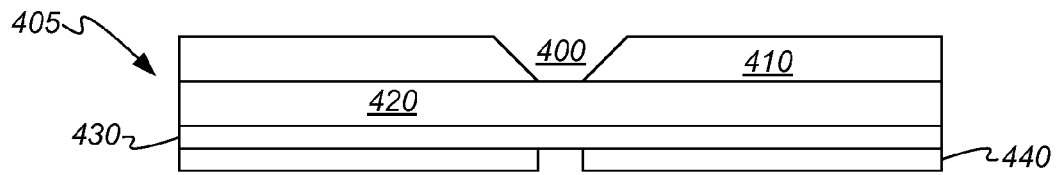
*FIG._17*
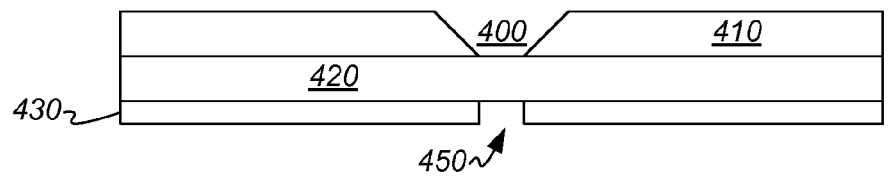
*FIG._18*
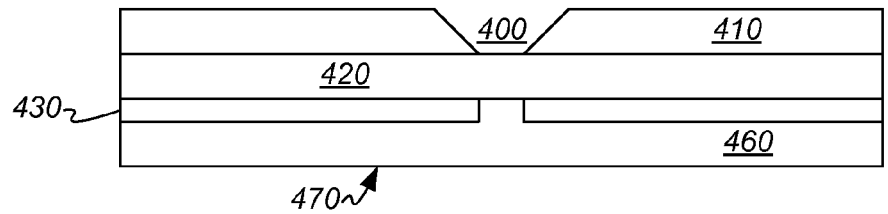
*FIG._19*
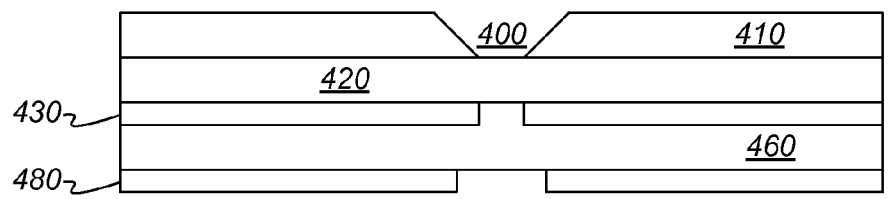
*FIG._20*

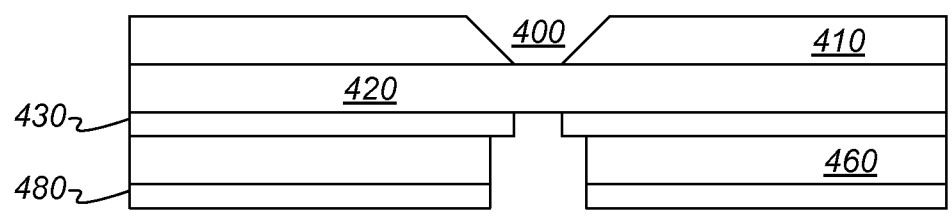
FIG._21
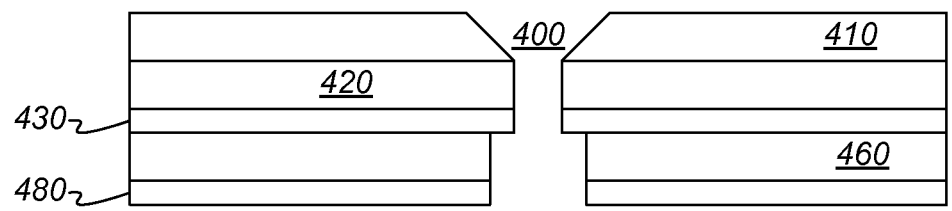
FIG._22

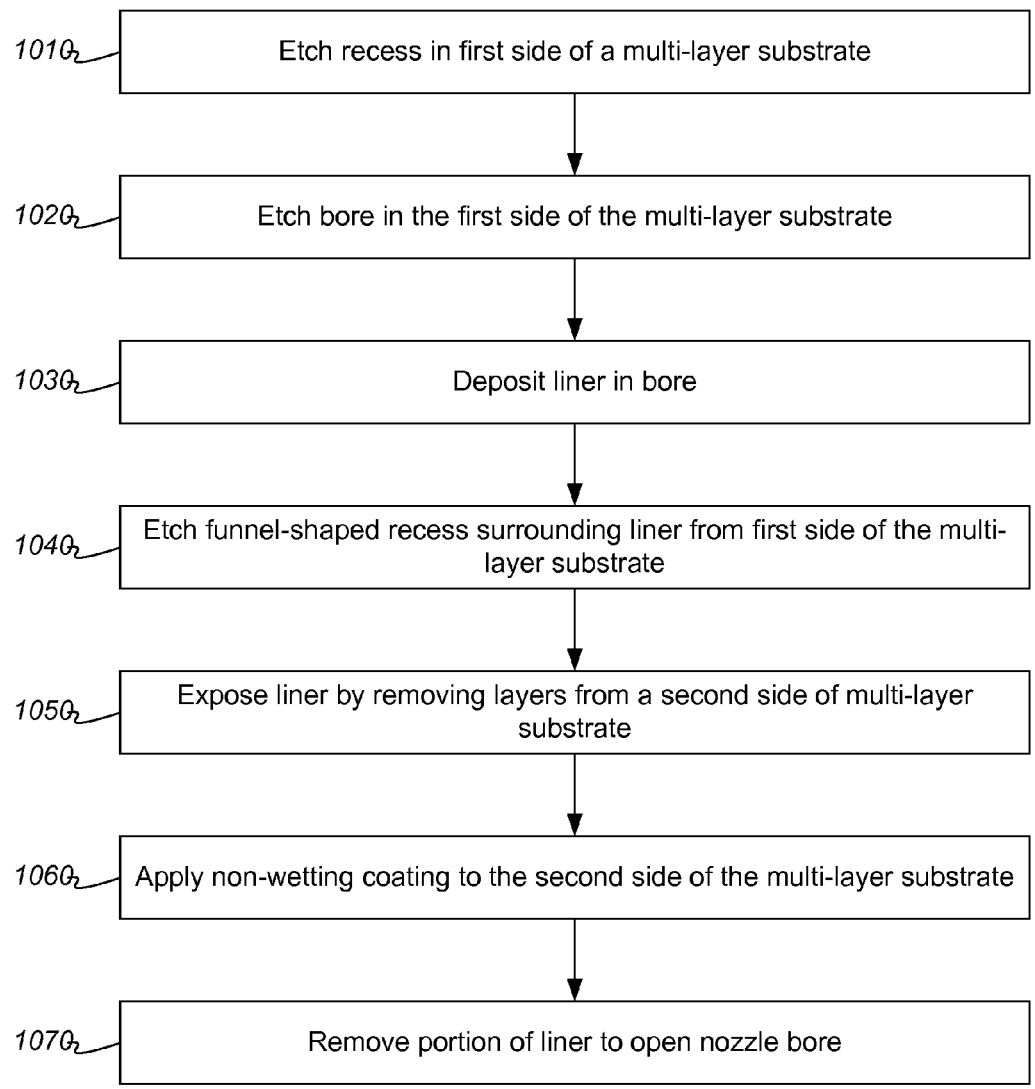
FIG._23

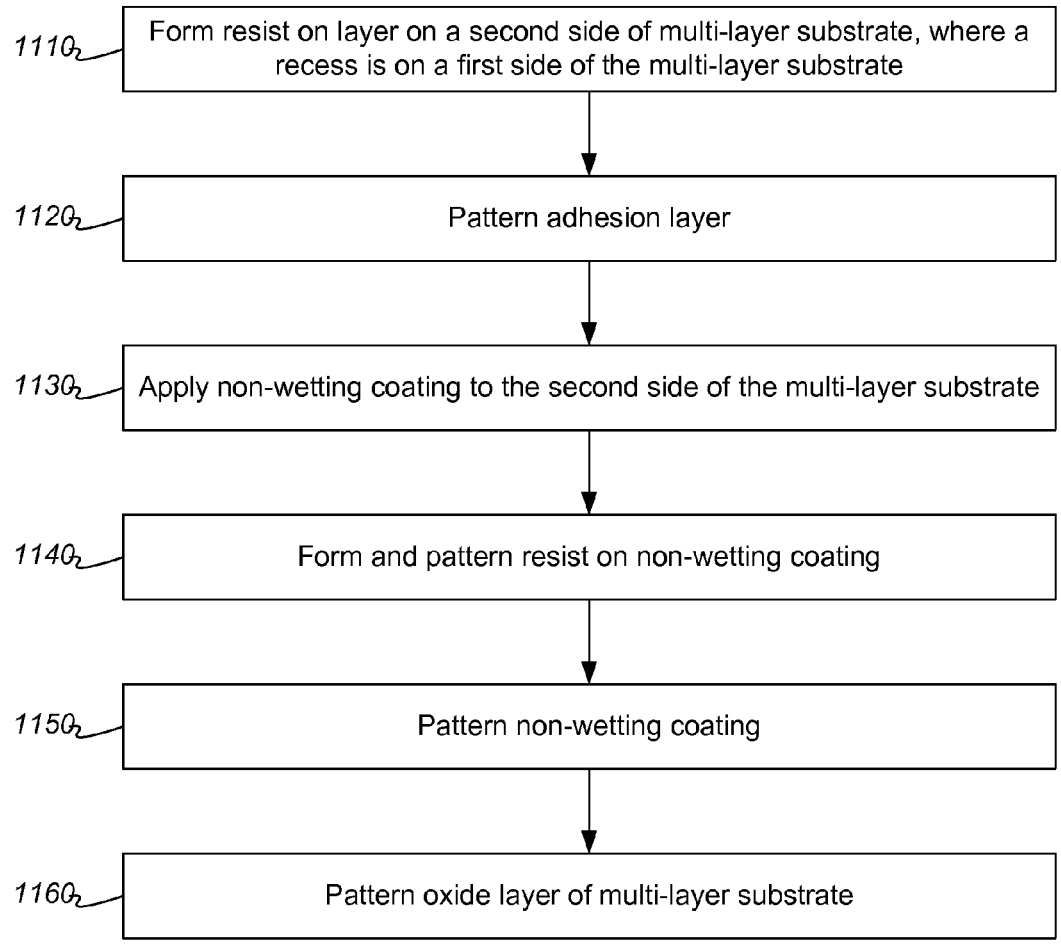
FIG._24

DURABLE NON-WETTING COATING ON FLUID EJECTOR

TECHNICAL FIELD

This disclosure relates generally to coatings on fluid ejectors.

BACKGROUND

A fluid ejector (e.g., an ink jet printhead) typically has an interior surface, an orifice through which fluid is ejected, and an exterior surface. When fluid is ejected from the orifice, the fluid can accumulate on the exterior surface of the fluid ejector, diverting further fluid from an intended path of travel or blocking it entirely (e.g., due to surface tension). Some materials from which fluid ejectors are fabricated (e.g., silicon) are hydrophilic, which typically exacerbates the problem of accumulation when fluids are ejected.

Non-wetting coatings can be used to coat surfaces. However, some types of materials are soft and are not durable coatings. Some coatings also can be expensive and difficult to pattern.

SUMMARY

In one aspect, a method of forming a nozzle plate of a fluid ejection device includes etching a bore in the first side of the multi-layer substrate, depositing a liner in the bore, removing a layer from a second side of the multi-layer substrate, wherein the removing exposes a closed end of the liner, applying a non-wetting coating to the closed end of the liner and an area surrounding the closed end of the liner, and removing the closed end of the liner, wherein removing the closed end of the liner opens a nozzle.

Implementations can include one or more of the following features. A recess may be etched in the oxide layer in first side of a multi-layer substrate prior to etching the bore. The bore may be formed in the oxide layer recess and may have a smaller diameter than the oxide layer recess. Applying a non-wetting coating may include spin-coating a self-planarizing material, e.g., a fluoropolymer. The non-wetting coating may be planarized prior to removing the closed end of the liner. The multi-layer substrate may include a silicon device layer, a buried oxide layer, and a handle layer, and etching the bore may include etching through the silicon device layer, the buried oxide layer, and only partially into the handle layer. Removing a layer from a second side of the multi-layer substrate may form a planar surface surrounding the closed end of the liner and the closed end of the liner protrudes from the planar surface. The closed end of the liner may be thinned prior to applying the non-wetting coating. An adhesion promoting layer may be applied to a second side of the multi-layer substrate prior to applying the non-wetting coating. The adhesion promoting layer may include metal, e.g., may consist of metal. The first side of the multi-layer substrate may be bonded to a body including a pumping chamber so that the pumping chamber is in fluid communication with the nozzle upon completion. A recess may be etched in the first side of the multi-layer substrate, wherein the recess surrounds an outer diameter of the liner. A liner may be deposited in the bore, includes depositing an initial liner having substantially parallel walls. A layer may be removed from a second side of the multi-layer substrate to expose a closed end of a nozzle liner. The initial liner may be removed after etching the recess and forming the nozzle liner. The nozzle liner may have a tapered portion leading to substantially parallel walls. The nozzle liner may be an oxide.

In another aspect, a method of forming a nozzle plate of a fluid ejection device includes patterning a layer of a multi-layer substrate, wherein the multi-layer includes a nozzle inlet on a first side and the patterning is performed in a region on the second side that corresponds to the nozzle inlet on the first side, after patterning the layer of the multi-layer substrate, applying a non-wetting coating to the second side of the multi-layer substrate, patterning the non-wetting coating to form an aperture in the non-wetting coating, and opening an aperture in a layer of the multi-layer substrate through the aperture in the non-wetting coating, wherein the opening creates a nozzle outlet that is in fluid communication with the nozzle inlet.

Implementations can include one or more of the following features. Patterning the layer of the multi-layer substrate may pattern an adhesion promoting layer. The adhesion promoting layer may include metal. Spin-coating a non-wetting coating may include applying a self-planarizing material, e.g., a fluoropolymer. The non-wetting coating may be planarized. Opening the aperture may include opening an aperture in an oxide layer.

In another aspect, a nozzle plate for a fluid ejection device includes a device layer having a first surface and an opposing second surface parallel to the first side, a first oxide layer disposed on the first side of the device layer, an adhesion promoting layer on the first oxide layer, a non-wetting layer on the adhesion promoting layer, a second oxide layer adjacent the second side of the device layer, and a nozzle passage extending along a first axis perpendicular to the first surface of the device layer through the second oxide layer, the device layer, the first oxide layer, the adhesion promoting layer and the non-wetting layer.

Implementations can include one or more of the following features. The first oxide layer may have a thickness of two microns or less. The second oxide layer has a thickness of one micron or more. The first oxide layer and the second oxide layer may consist of silicon oxide. The adhesion promoting layer may be a metal or a metal oxide, e.g., tantalum or titanium or an oxide of tantalum or titanium. The adhesion promoting layer may be a planar film extending perpendicular to the first axis. The planar film of the adhesion promoting layer may not extend parallel to the first axis. A liner may coat an interior surface of the nozzle. The liner may coat the side of the second oxide layer farther from the device layer. The liner may be a nitride, silicon dioxide or metal. Ends of the liner may be rounded. The device layer may consists of silicon. The nozzle may include a tapered section. A top of the tapered section may be aligned with a top of the device layer.

Certain implementations may have one or more of the following advantages. Methods of fabrication of the fluid ejector described herein can provide for self-alignment of the apertures in the non-wetting coating and the nozzles, thus improving alignment and reducing the likelihood of non-straight jetting. Non-porous adhesion layers can be used to adhere the non-wetting coating to the nozzle plate. Non-porous adhesion layers are less likely to be attacked by aggressive fluids, e.g., alkaline inks than porous adhesion layers. Thus, the adhesion layer is less likely to degrade. This allows the non-wetting coating layer to remain on the surface of the nozzle plate longer, extending the life of the non-wetting coating layer and the time that the device is able to jet more accurately. Spin-on non-wetting coating layers can be made thicker, which can make the coatings more robust than vapor deposited layers. The coatings described herein enable the device to be used with more corrosive materials. Thus, the jetting device has a broader applicability and flexibility in terms of the types of materials that it can jet.

The details of one or more implementations of the invention are set forth in the accompanying drawings and the description below. Other features, objects, and advantages will be apparent from the description and drawings, and from the claims.

DESCRIPTION OF DRAWINGS

FIG. 1 is a cross-sectional side view of a single jetting structure.

FIGS. 2-16 show forming a nozzle with a non-wetting coating in a nozzle plate.

FIGS. 17-22 show forming a non-wetting coating on a nozzle plate.

FIGS. 23 and 24 are flow diagrams for forming non-wetting coatings on nozzle plates.

Like reference symbols in the various drawings indicate like elements.

DETAILED DESCRIPTION

Vapor phase coatings can be susceptible to etching by particular types of fluids, such as corrosive fluids, e.g., urea-containing inks. On the other hand, certain types of spin coated materials, such as fluoropolymers, can be resistant to such corrosive fluids, but are potentially subject to delamination. In order to address these problems, a non-porous adhesion layer can be used to adhere the non-wetting coating to the nozzle plate. Non-porous adhesion layers are less likely to be attacked by aggressive fluids, e.g., alkaline inks than porous adhesion layers.

Another difficulty in applying spin coated materials onto a nozzle layer is keeping the nozzles passages clear of the spin coated material. If the coating is applied before the nozzle passages are opened to avoid the material entering the nozzles, it can be difficult to precisely photolithographically align an aperture in the coating with a nozzle bore. The alignment difficulty can stem at least in part from front-to-back registration errors and small deformations in the nozzle layer due to the nozzle layer being bonded to another layer and potentially not being perfectly flat. Thus, warping can occur in the location of the nozzles with respect to a mask or grid that indicates where the nozzles should be located. Misregistration of the apertures in the non-wetting coating and the nozzles can result in nozzle asymmetry, affecting the straightness of the ejected drops of fluid. In order to address these problems, some methods of fabrication of the fluid ejector can provide for self-alignment of the apertures in the non-wetting coating and the nozzles, thus improving alignment and reducing the likelihood of non-straight jetting.

FIG. 1 is a cross-sectional view of a single jetting structure of a fluid ejector 100, such as an ink jet printing device. Similar structures are described in U.S. application Ser. No. 12/712,614 filed Feb. 25, 2010. Only a single jetting structure is shown, although a die of a fluid ejector may include tens, hundreds or even thousands of jetting structures.

A fluid, such as ink, enters the device, e.g., from a reservoir (not shown), through passage 20 in a body 10, e.g., an interposer. The body 10 can be a cover layer that protects electrical components from exposure to the fluid and optionally can include electrical elements, such as circuits. The fluid enters a fill channel 32 of a body 30, which leads to a pumping chamber 35. A membrane 40 on the body 30 supports an actuator 50 above the pumping chamber 35. The actuator 50 is capable of bending the membrane 40 either into or away from the pumping chamber 35, thereby expelling fluid out of the pumping chamber 35 through an orifice 60 in a nozzle plate 55 or filling the pumping chamber 35 from an inlet in the membrane 40. In some implementations, the nozzle has a diameter of between about 2 and 20 microns.

A non-wetting coating 65 is on the nozzle plate 55 as an outermost layer exposed to the environment. The non-wetting coating 65 is formed so that the orifice in the coating is aligned with the orifice 60 in the nozzle plate 55. The orifice 60 in the nozzle plate can be round, oval, square, or rectangular. Although many types of materials can be used for non-wetting coatings, spin-on coatings are one option for non-wetting coatings. The non-wetting coating can be formed from a fluoropolymer, such as a fluoropolymer that has good solubility in fluorinated solvent due to its amorphous morphology. Suitable spin-coatable fluoropolymers can include perfluorotrialkylamine, such as Cytop™, available from Asahi Glass Company, Tokyo, Japan. One potential difficulty with applying a spin-on non-wetting coating is aligning an aperture in the non-wetting coating with the orifice in the nozzle layer, while simultaneously not introducing the non-wetting coating into the nozzle.

One implementation of a method for forming a nozzle plate is described in FIG. 23. Details of this implementation the method are found in FIGS. 2-16.

Referring to FIG. 2, a multi-layer substrate, such as an SOI wafer 200, includes a handle layer 210, a buried oxide layer 215, sometimes referred to as the BOX, and a device layer 220. The handle layer 210 and the device layer 220 can be silicon. In some implementations, the handle layer 210 has a thickness of about 600 microns, the device layer 220 has a thickness of about 30 microns and the buried oxide layer 215 therebetween has a thickness of just a few microns, such as 2 or less, such as 1 micron. The multi-layer substrate has a first side or back side closest to the device layer 220 and a second side or front side closest to the handle layer 210.

Referring to FIG. 3, fiducials 230 are etched into the device layer 220. The fiducials 230 allow for alignment of masks at a later stage in the processing. An oxide layer 235, e.g., a thermal oxide, is grown on the device layer 220 and an oxide layer 240, e.g., a thermal oxide, is grown on the handle layer 210, opposite to the device layer 220. In some implementations, the oxide layer 235 has a minimum thickness of 1 micron. Referring to FIG. 4, a recess 250 is then etched into a first side or back side of the multi-layer substrate (step 1010 in FIG. 23). In some implementations, the recess is formed in the oxide layer 235 that directly contacts the device layer 220. The recess 250 forms an aperture that extends entirely through the oxide layer 235. The recess 250 can be etched using a wet etch, such as a buffered oxide etch (BOE) etch, or with a dry etch. Lithography can be used to locate the recess 250 in the desired location.

Referring to FIG. 5, a bore is etched into the first side of the multi-layer substrate (step 1020 of FIG. 23). A sacrificial layer 260, e.g., layer of resist is applied to the oxide layer 235. The sacrificial layer 260 is patterned with an aperture having a desired cross section, such as round, oval, rectangular, square or other shape. The aperture in the sacrificial layer 260 is located within the recess 250. The aperture in the sacrificial layer 260 can have a smaller lateral diameter than the lateral dimension of the aperture 250 in the oxide layer 235. In some implementations, the aperture in the sacrificial layer is centered with a center of the recess 250 in the oxide layer 235. The multi-layer substrate is then etched, using the sacrificial layer 260 as a mask, to form the bore or recess 265. Recess 265 extends through device layer 220, through buried oxide layer 215 and partially into (but not entirely through) the handle layer 210. In some implementations, the etch into the handle layer 210 is between about 1 and 5 microns, such as around 2 microns. The recess 265 can be formed by multiple etch steps.

Referring to FIG. 6, a liner is deposited in the bore (step 1030 of FIG. 23). The liner can be an initial liner 270 of multiple liners that are applied. The initial liner 270 can protect the walls and floor of the recess 265 and part of the device layer from etching, e.g., from KOH etching. The resist 260 can be removed before the liner 270 is applied so that the liner can be applied at high temperature. The initial liner 270 can be a nitride, silicon dioxide or metal. A nitride liner can be formed by low pressure chemical vapor deposition (LPCVD). An oxide liner can be applied by plasma (PECVD) or thermal means. Metal can be applied using CVD. In one implementation, the initial liner can be deposited into the recess 265 after the sacrificial layer 260 is removed. In some implementations, the initial liner 270 has a minimum thickness of 0.2 microns.

A dry etch can be used to remove the portion of the initial liner 270 that is on the face of the device layer 220. The dry etch with etch the initial liner 270 more slowly on the sidewalls and floor of the cavity 235, so no mask may be needed to selectively leave the initial liner 270 in these locations while removing it from the face of the device layer 220, as shown in FIG. 8. Optionally, if a dry etch selectivity is insufficient, the initial liner over the cavity 235 may be filled with a photoresist 280 prior to dry etching, as shown in FIG. 7, and the photo resist can be stripped after the etch. In some implementations, the initial liner 270 has a cylindrical wall layer and a bottom and is hollow along a central region. In some implementations, a cross section of the liner appears to be approximately T-shaped, with a closed bottom, a hollow vertical portion and horizontal portions extending outwardly from a top of the liner.

Whether the resist is required can depend on the material of the initial liner 270. For example, if the initial liner 270 is formed of an oxide, it can be difficult to etch the oxide at the bottom of the liner region, that is, the portion closest to the handle layer 210, and the resist 280 may not be required. The resist can be spun on, exposed and developed so that it is only located in the desired regions and does not coat an entirety of the oxide layer 235.

Referring to FIG. 8, if any of the initial liner material remains on the device layer 220, the initial liner material is removed from a top surface of the multi-layer substrate. An etch, such as a dry etch, can be used to remove the initial liner material. The dry etch is selective, removing more material from horizontal surfaces than from vertical surfaces. The etch can also thin the oxide layer 235.

Referring to FIG. 9, a funnel-shaped recess surrounding the initial liner is etched from the first side of the multi-layer substrate (step 1040 of FIG. 23). The funnel 290 is etched around the initial liner and into the device layer 220. A wet etch, e.g., a KOH etch, can be used to etch the funnel 290. If a resist 280 was present within the initial liner 270, the resist can be removed prior to etching the funnel. In some implementations, the funnel 290 extends all the way down to the buried oxide layer 215. In some implementations, the funnel 290 extends partially into, but not entirely through, the device layer 220. Because of the crystal planes of the silicon, the funnel shape can be a frusto-pyramidal shape, that is, a pyramid with the apex portion removed to have two parallel sides.

Referring to FIG. 10, optionally, the initial liner 270 is removed. The initial liner 270 can be stripped, such as with hot phosphoric acid for a silicon nitride liner or hydrofluoric (HF) acid for a silicon dioxide liner. A nozzle liner 300 is then formed in the recess where the initial liner was previously located. The nozzle liner 300 can be formed of an oxide or a nitride. The nozzle liner 300, like the initial liner, has a bottom surface and walls surrounding a hollow space, such as cylindrical or rectangular walls, although other shapes for the space are possible. The nozzle liner 300 is formed to be less than about 1 micron thick, e.g., between 0.2 and 1 micron thick. In some implementations, the liner 300 is a thermally grown oxide (in which case the liner may be present only on the surfaces of the device layer 220 and handle layer 210. In some implementations, only a single liner is formed rather than forming two separate liners. Therefore, the initial liner and the nozzle liner are the same.

The first side of the multi-layer substrate, such as the oxide layer 235 or the liner 300, is bonded to a new layer, as shown in FIG. 11. In some implementations, the new layer is a base substrate 310 that includes features of the jetting device, such as the pumping chamber, as described with respect to FIG. 1. The base substrate 310 can be bonded to the multi-layer substrate using a bonding material or by fusion bonding silicon to silicon or silicon to silicon oxide.

A portion of the liner, such as a closed off end portion closest to the second side of the multi-layer substrate is then exposed by removing layers from the second side or the front side of the multi-layer substrate (step 1050 of FIG. 23). As shown in FIG. 12, the oxide layer 240 and the handle layer 210 are removed. The removal can be achieved by a combination of grinding, polishing and dry etching. For example, the oxide layer 240 can be removed by dry etch, the handle layer 210 can be partially removed by grinding and the remaining handle layer material after the grinding process can be etched using a wet or dry etch that is selective to the thermal oxide 300 and buried oxide layer 215. Removing material from the second side of the multi-layer substrate forms a planar surface surrounding a closed end of the nozzle liner 300. In some implementations, the nozzle liner 300 protrudes out from surrounding planar surface. Optionally, the nozzle liner 300, such as the portion of the nozzle liner 300 that is a closed end, can be thinned.

Referring to FIG. 13, optionally an adhesion promoting layer 330 is applied to the now-exposed buried oxide layer 215. In some implementations, the adhesion promoting layer 330 is a layer of metal, such as tantalum or titanium or an oxide of one of these materials. In some implementations, the adhesion promoting layer 330 is a silicone adhesion promoter. In some implementations, the adhesion promoting layer 330 is non-porous and can be continuous without pinholes. However the adhesion promoting layer 330 can be formed of any material that helps adhere the subsequent non-wetting coating to the device.

Referring to FIG. 14, a layer of non-wetting material is applied to the second side of the multi-layer substrate (step 1060). The non-wetting material can either be self-planarizing or can be planarized to form a planar surface to the non-wetting layer 340. As noted above, the non-wetting material can be a fluorocarbon material, such as Teflon (PTFE) or Cytop™. In some embodiments, the non-wetting layer 340 is applied with a thickness of 0.5 microns or more, such as 1 micron or more. A relatively thick, e.g., greater than 1 micron non-wetting layer 340 can be desirable when the material etches faster than the adhesion promoting layer or the oxide layer on which it is applied. As an alternative to spin coating, the material can be applied by spray coating or chemical vapor deposition (CVD). Some types of coatings, such as CVD applied coatings and spray coatings are not self leveling, but are conformal. Chemical mechanical polishing (CMP) can be used to planarize conformal coatings as well as to expose the bottom surface of the nozzle liner 300 so that the nozzle can be opened.

Referring to FIG. 15, the portion of the nozzle liner that is adjacent to the second side of the multi-layer substrate is removed to open the nozzle bore (step 1070 of FIG. 23). The non-wetting layer 340, the optional adhesion promoting layer 330 and the bottom of the nozzle liner 300 layer are etched to open of the nozzle. Some non-wetting coating materials act as a resist. Thus, the non-wetting coating 340 after being patterned to have an aperture aligned with the nozzle, is used as a mask in an etching process to etch through the adhesion promoting layer 330 and nozzle liner 300. The non-wetting coating can be etched, such as by a dry plasma etch, e.g., a $CF_4$ plasma etch. The etching can thin the non-wetting coating. The optional adhesion promoting layer 330 and the bottom of the nozzle liner 300 layer can be etched with suitable etching conditions.

Referring to FIG. 16, without the adhesion promoting layer, the non-wetting layer 340 is closer to the outer diameter of the nozzle. As can be seen, the etching can form a radiused end on the nozzle liner 300 layer that defines the nozzle aperture. Also, if the non-wetting coating etches too much faster than the oxide that defines the nozzle, this can cause the nozzle to have a projecting portion 350. If a wiping mechanism is used to clean the nozzle plate, such as to maintain the nozzle plate, the projecting nozzles can be too fragile for cleaning. Thus, it can be advantageous to reduce any projections on the nozzle plate, such as by optimizing the thickness of the non-wetting coating when it is applied, or etching off the protruding film with a vapor or plasma process.

In an alternative method, instead of the nozzle negative space being formed entirely from one side of the multi-layer substrate, the nozzle can be formed from both sides of a multi-layer substrate. The method is described in FIG. 24 and the steps are shown in FIGS. 17-22.

Referring to FIG. 17, a nozzle inlet 400 is formed in a multi-layer substrate 405, such as in a first side or back side of the multi-layer substrate. The nozzle inlet 400 can be formed in a layer of silicon 410, such as by wet etching, e.g., KOH etching, the silicon. The wet etch can provide the inlet 400 with tapered sides, e.g., a frusto-pyramidal shape. The etch stops on an oxide layer 420. The oxide layer 420 is a planar intact or continuous layer. Optionally, an adhesion promoting layer, such as a metal layer 430, for example a layer of titanium or tantalum, is on an opposite side of the oxide layer 420 from the nozzle inlet 400, that is, on the second side of the multi-layer substrate. Alternatively, a metal oxide layer, such as $Ta_2O_5$ or $TiO_2$ is used instead of metal layer 430.

A resist is formed on the second side of the multi-layer substrate (step 1110 of FIG. 24). Thus, the layer of photoresist 440 is on an opposite side of the metal layer 430 from the oxide layer 420. The layer of photoresist 440 is patterned with the desired nozzle outlet geometry and dimensions. The layer of photoresist 440 is patterned so that a nozzle outlet will be formed in a region on the second side of the multi-layer substrate that corresponds to the nozzle inlet 400 on the first side of the multi-layer substrate and so that the inlet and the outlet are in fluid communication with one another once the nozzle plate is completed. The photoresist 440 can be patterned by aligning fiducials in the substrate to a mask. The nozzle layer can be processed prior to being adhered to another layer to reduce any likelihood of the nozzle layer being deformed due to bonding.

Referring to FIG. 18, the aperture formed in the photoresist 440 is used to pattern the second side of the multi-layer substrate, such as an adhesion promoting layer (step 1120 of FIG. 24). That is, the photoresist 440 is used as a mask in etching of the underlying layer. If the adhesion promoting layer is a metal layer 430, the metal layer 430 can be etched, such as with HF. The photoresist 440 is stripped. A non-wetting coating layer 460 is then formed on the second side of the multi-layer substrate (step 1140 of FIG. 24). The non-wetting coating layer 460 fills the aperture 450 and forms a planar surface 470, as shown in FIG. 19. If the non-wetting coating layer 460 is conformal to the recesses in the metal layer 430, the layer can be polished or etched to form the planar surface 470. A further layer of photoresist 480 is applied to the non-wetting coating layer 460 and patterned, as shown in FIG. 20. The mask for patterning the photoresist can be aligned using infrared or front-back alignment techniques with a stepper. The dimensions of the aperture formed in the further layer of photoresist 480 are wider than the aperture in the metal layer 430. The non-wetting coating layer 460 is then patterned (step 1150 of FIG. 24), as shown in FIG. 21, e.g., using the photoresist 480 as a mask in an etch step that etches the underlying non-wetting coating 460. Optionally, the further layer of photoresist 480 is removed.

Referring to FIG. 22, the oxide layer 420 from the second side of the multi-layer substrate is etched to complete the nozzle opening (step 1160 of FIG. 24). This series of steps forms a nozzle plate with nozzles, which can then be bonded to a device body.

As an alternative, a metal layer, such as a layer of nickel, can be used inside of the oxide.

A number of embodiments of the invention have been described. Nevertheless, it will be understood that various modifications may be made. Accordingly, other embodiments are within the scope of the following claims.

All references referred to herein are incorporated by reference for the purpose of their disclosure.

What is claimed is:

1. A method of forming a nozzle plate of a fluid ejection device, comprising:
    etching a bore in a first side of a multi-layer substrate, the bore extending from the first side towards a second side of the multi-layer substrate opposite to the first side without being open to the second side;
    forming a liner in the bore, the liner having a bottom surface and walls surrounding a hollow space within the bore, the bottom surface and at least portions of the walls forming a closed end separating the hollow space from the multi-layer substrate;
    removing a layer from the second side of the multi-layer substrate, wherein the removing exposes the closed end of the liner at the second side without exposing the hollow space at the second side;
    applying a non-wetting coating to the closed end of the liner and an area surrounding the closed end of the liner; and
    removing the closed end of the liner, wherein removing the closed end of the liner opens a nozzle connected to the hollow space.

2. The method of claim 1, further comprising etching an oxide layer recess in the first side of the multi-layer substrate prior to etching the bore, wherein the bore is formed in the oxide layer recess and has a smaller diameter than the oxide layer recess.

3. The method of claim 1, wherein applying the non-wetting coating includes spin-coating a self-planarizing material.

4. The method of claim 3, wherein the self-planarizing material is a fluoropolymer.

5. The method of claim 1, further comprising planarizing the non-wetting coating prior to removing the closed end of the liner.

6. The method of claim 1, wherein the multi-layer substrate includes a silicon device layer, a buried oxide layer, and a handle layer and etching the bore includes etching through the silicon device layer, the buried oxide layer, and only partially into the handle layer.

7. The method of claim 1, wherein removing the layer from the second side of the multi-layer substrate forms a planar surface surrounding the closed end of the liner and the closed end of the liner protrudes from the planar surface.

8. The method of claim 1, further comprising thinning the closed end of the liner prior to applying the non-wetting coating.

9. The method of claim 1, further comprising applying an adhesion promoting layer to the second side of the multi-layer substrate prior to applying the non-wetting coating.

10. The method of claim 9, wherein the adhesion promoting layer includes metal.

11. The method of claim 9, wherein the adhesion promoting layer consists of metal.

12. The method of claim 1, further comprising bonding the first side of the multi-layer substrate to a body including a pumping chamber so that the pumping chamber is in fluid communication with the nozzle upon completion.

13. The method of claim 1, further comprising etching a recess in the first side of the multi-layer substrate, wherein the recess surrounds an outer diameter of the liner.

14. The method of claim 13, wherein:
depositing the liner in the bore includes depositing an initial liner having substantially parallel walls, and
removing the layer from the second side of the multi-layer substrate exposes a closed end of a nozzle liner, the method further comprising:
removing the initial liner after etching the recess and forming the nozzle liner, wherein the nozzle liner has a tapered portion leading to substantially parallel walls.

15. The method of claim 14, wherein the nozzle liner is formed of oxide.

16. A method of forming a nozzle plate of a fluid ejection device, comprising:
etching a bore in a first side of a multi-layer substrate;
depositing a liner in the bore;
removing a layer from a second side of the multi-layer substrate, wherein the removing exposes a closed end of the liner;
applying a non-wetting coating to the closed end of the liner and an area surrounding the closed end of the liner;
planarizing the non-wetting coating; and
removing the closed end of the liner after planarizing the non-wetting coating, wherein removing the closed end of the liner opens a nozzle.

17. A method of forming a nozzle plate of a fluid ejection device, comprising:
etching a bore in a first side of a multi-layer substrate, wherein the multi-layer substrate comprises a silicon device layer, a buried oxide layer, and a handle layer, and wherein etching the bore comprises etching through the silicon device layer, the buried oxide layer, and only partially into the handle layer;
depositing a liner in the bore;
removing a layer from a second side of the multi-layer substrate, wherein the removing exposes a closed end of the liner;
applying a non-wetting coating to the closed end of the liner and an area surrounding the closed end of the liner; and
removing the closed end of the liner, wherein removing the closed end of the liner opens a nozzle.

* * * * *